United States Patent
Martin et al.

(10) Patent No.: US 7,508,064 B2
(45) Date of Patent: *Mar. 24, 2009

(54) PACKAGE FOR SEALING AN INTEGRATED CIRCUIT DIE

(75) Inventors: John R. Martin, Foxborough, MA (US); Carl M. Roberts, Jr., Topsfield, MA (US)

(73) Assignee: Analog Devices, Norwood, MA (US)

( * ) Notice: Subject to any disclaimer, the term of this patent is extended or adjusted under 35 U.S.C. 154(b) by 327 days.

This patent is subject to a terminal disclaimer.

(21) Appl. No.: 11/169,276

(22) Filed: Jun. 28, 2005

(65) Prior Publication Data

US 2005/0269678 A1 Dec. 8, 2005

Related U.S. Application Data

(63) Continuation of application No. 10/662,895, filed on Sep. 15, 2003, now Pat. No. 6,911,727, which is a continuation of application No. 09/947,859, filed on Sep. 6, 2001, now Pat. No. 6,621,158, which is a continuation of application No. 08/471,748, filed on Jun. 6, 1995, now Pat. No. 6,323,550.

(51) Int. Cl.
*H01L 23/12* (2006.01)

(52) U.S. Cl. ............... 257/704; 257/710; 257/E23.193

(58) Field of Classification Search ......... 257/678–680, 257/689, 704, 710, 724

See application file for complete search history.

(56) References Cited

U.S. PATENT DOCUMENTS

| | | | |
|---|---|---|---|
| 4,276,533 A | 6/1981 | Tominaga et al. | 338/4 |
| 4,700,973 A | 10/1987 | Gademann et al. | 280/735 |
| 4,812,896 A | 3/1989 | Rothgery et al. | 174/52.4 |
| 4,829,822 A | 5/1989 | Imai et al. | 73/516 |
| 4,862,245 A | 8/1989 | Pashby et al. | 357/70 |
| 4,891,984 A | 1/1990 | Fujii | 73/517 |
| 4,894,698 A | 1/1990 | Hisikigawa | 257/254 |
| 4,906,586 A | 3/1990 | Blackburn | 257/254 |
| 4,922,756 A | 5/1990 | Henrion | 73/517 |

(Continued)

FOREIGN PATENT DOCUMENTS

EP 0 363 003 8/1989

(Continued)

OTHER PUBLICATIONS

IFEE Transactions on Electron Devices, vol. Ed026. No. 12 Dec. 1979 "A Batch-Fabricated Silicon Acclerometer".

(Continued)

*Primary Examiner*—Hoai v Pham
(74) *Attorney, Agent, or Firm*—Wilmer Cutler Pickering Hale & Dorr LLP

(57) ABSTRACT

A die has a part that is sealed with a cap. The seal can be hermetic or non-hermetic. If hermetic, a layer of glass or metal is formed in the surface of the die, and the cap has a layer of glass or metal at a peripheral area so that, when heated, the layers form a hermetic seal. A non-hermetic seal can be formed by bonding a cap with a patterned adhesive. The cap, which can be silicon or can be a metal paddle, is electrically coupled to a fixed voltage to shield the part of the die.

17 Claims, 3 Drawing Sheets

U.S. PATENT DOCUMENTS

| | | | | |
|---|---|---|---|---|
| 4,965,654 | A | 10/1990 | Karner et al. | 357/70 |
| 5,006,487 | A | 4/1991 | Stokes | 437/228 |
| 5,044,201 | A | 9/1991 | Farace | 73/503 |
| 5,086,018 | A | 2/1992 | Conru et al. | 437/207 |
| 5,090,254 | A | 2/1992 | Guckel | 73/862.59 |
| 5,121,180 | A | 6/1992 | Beringhause et al. | 357/26 |
| 5,126,813 | A | 6/1992 | Takahashi et al. | 357/26 |
| 5,164,328 | A | 11/1992 | Dunn | 437/54 |
| 5,181,156 | A | 1/1993 | Gutteridge | 361/283 |
| 5,185,498 | A | 2/1993 | Sanftleben et al. | 174/52.2 |
| 5,185,653 | A | 2/1993 | Switky et al. | 257/729 |
| 5,216,490 | A | 6/1993 | Greiffer et al. | 257/659 |
| 5,310,450 | A | 5/1994 | Offenberg et al. | 156/630 |
| 5,323,051 | A | 6/1994 | Adams | 257/417 |
| 5,376,588 | A | 12/1994 | Pendse | 156/293 |
| 5,406,117 | A | 4/1995 | Dlugokecki et al. | 257/659 |
| 5,428,242 | A | 6/1995 | Furuya et al. | 257/659 |
| 5,486,720 | A | 1/1996 | Kierse | 257/659 |
| 5,629,559 | A | 5/1997 | Miyahara | 257/666 |
| 5,659,950 | A | 8/1997 | Adams et al. | 29/827 |
| 6,911,727 | B1 * | 6/2005 | Martin et al. | 257/704 |
| 2003/0102552 | A1 | 6/2003 | Martin et al. | |
| 2003/0116825 | A1 | 6/2003 | Geefay et al. | |
| 2003/0155649 | A1 | 8/2003 | Wood et al. | |

FOREIGN PATENT DOCUMENTS

| | | |
|---|---|---|
| EP | 0 618 450 | 5/1994 |
| EP | 0618450 | 5/1994 |
| EP | 0 646 798 | 5/1995 |
| EP | 0646798 | 5/1995 |
| JP | 1232267 | 9/1989 |
| JP | 03120849 A | 5/1991 |

OTHER PUBLICATIONS

IFEE Transactions on Electron Devices, vol. Ed-27, No. 5, May 1980 "A Monolithic Capacitive Pressure Sensor with Pulse-Period Output".

Sensors and Actuators, 4 (1983) 191-198, "A Micromechanical Capacitive Accelerometer with a Two-Point Inertial-Mass Suspension".

Sensors, Sep. 1989, "Understanding Silicon Accelerometers".

Sensors, Sep. 1991 "Micromachined Sensors for Automotive Applications".

Electronic Packaging and Production, vol. 33, No. 12, Dec. 1, 1993, pp. 44-45, Adams, V. et al, "Low Cost Packaging for Accelerometers".

IFEE Transactions on Electron Devices, vol. Ed026. No. 12 Dec. 1979 "A Batch-Fabricated Silicon Accelerometer".

Sensors, Sep. 1991, Micromachined Sensors for Automotive Applications.

Adams, V. et al., "Low Cost Packaging for Accelerometers," Electronic Packing and Production, vol. 33, No. 12, pp. 44-45 (1993).

IFEE Transactions on Electron Devices, "A Batch-Fabricated Silicon Accelerometer," vol. Ed-26, No. 12 (1979).

IFEE Transactions on Electron Devices, "A Monolithic Capacitive Pressure Sensor with Pulse-Period Output," vol. Ed-27, No. (1980).

Sensors and Actuators, "A Micromechanical Capacitive Accelerometer with a Two-Point Inertial-Mass Suspension," vol. 4, pp. 191-198 (1983).

Sensors, "Understanding Silicon Accelerometers," Sep. (1989).

Sensors, "Micromachined Sensors for Automotive Applications," Sep. (1991).

"Motorola Develops Rugged New Accelerometer," Press Release, Motorola Inc., Oct. 1992.

Gardner, Dana, "Motorola broadens scope of sensors products," Design News, Jul. 1992.

Yun, Weijie and Howe, Roger T., Recent Developments in Silicon Microaccelerometers, Sensors, Oct. 1992.

"Three-Plate Capacitor is Transformed into a Microaccelerometer," Sensors Mar. 1993.

Adams, V., Frank, R., and Hughes, H., "Low Cost Packaging For Accelerometers," Electronic Packaging & Production, Dec. 1993.

Ajluni, Cheryl, "Silicon Accelerometer Targets Airbag Restraint Systems," Electronic Design, Oct. 1995.

Terry, S., "A miniature Silicon Accelerometer with Built-in Damping," IEEE Solid-State Sensor and Actuator Workshop, Jun. 1988.

de Bruin, D., Allen, H., Terry, S., "Second-order Effects in Self-testable Accelerometers" IEEE Solid-State Sensor and Actuator Workshop, Jun. 1990.

Alan, H., Terry, S., and Knutti, J., "Understanding Silicon Accelerometers," Sensors, Sep. 1989.

"Silicon Accelerometers," ICSensors, Technical Note TN-008 (no date).

Allen, H., Terry, S., de Bruin, D., "Accelerometer Systems with Built-in Testing," IC Sensors, 1989.

Peeters, E., Vergote, S., Puers, B., and Sansen, W., "A Highly Symmetrical Capacitive Micro-Accelerometer with Single Degree-of-Freedom Response," International Conference on Solid-State Sensors and Actuators, 1991.

Henrion, W., DiSanza, L., Ip, M., Terry, S., and Jerman, H., "Wide Dynamic Range Direct Digital Accelerometer," IEEE Solid-State Sensor and Actuator Workshop, Jun. 1990.

Ristic, L., Gutteridge, R., Dunn, B., Mietus, D., and Bennet, P., "Surface Micromachined Polysilicon Accelerometer," IEEE Solid-State Sensor and Actuator Workshop, Jun. 1992.

Ristic, L., Gutteridge, R., Kung, J., Koury, D., Dunn, B., and Zunio, H., "A Capacitive Type Accelerometer with Self-Test Feature based on a Double-Pinned Polysilicon Structure," 7th International Conference on Solid-State Sensors and Actuators, Jun. 1993.

Ristic, L. (editor), Sensor Technology and Devices, (pp. 234-237), 1994.

Li, G. and Tseng, A., "Low Stress Packaging of a Micromachined Accelerometer," IEEE Transactions on Electronics Packaging Manufacturing, vol. 24, No. 1, Jan. 2001.

* cited by examiner

PACKAGE FOR SEALING AN INTEGRATED CIRCUIT DIE

CROSS REFERENCED TO RELATED APPLICATION

This application is a continuation of U.S. application Ser. No. 10/662,895 filed Sep. 15, 2003 now U.S. Pat. No. 6,911,727, which is a continuation of U.S. application Ser. No. 09/947,859, filed Sep. 6, 2001, now U.S. Pat. No. 6,621,158, which is a continuation of U.S. application Ser. No. 08/471,748, filed Jun. 6, 1995, now U.S. Pat. No. 6,323,550, the entirety of which is incorporated herein by reference.

FIELD OF THE INVENTION

The present invention relates to packaging and sealing an integrated circuit die.

BACKGROUND OF THE INVENTION

To package a device in plastic, a typical die having an integrated circuit in a top face is bonded onto a paddle so that the bottom face of the die is bonded to the paddle. The die is then coupled to a leadframe with wirebonds. The die, paddle, and leadframe are encapsulated in plastic by flowing plastic over them at high temperature and pressure. This typical encapsulating process cannot be used with some dies, such as micromachined devices that have movable components, because the flowing plastic would affect the movement of the movable components.

Instead of packaging in plastic, some devices are packaged in hermetic containers to keep moisture away from the die. Several different types of packages are used, including a ceramic dual in-line package (cerdip), a ceramic side braze package, and a generally cylindrical metal package.

In such packages, the die is typically bonded to the inside of the package with a die attach, and then the package is sealed. A typical die attach in a cerdip process uses a silver paste. Such a paste can provide stress to a die, thus potentially degrading long-term performance.

SUMMARY OF THE INVENTION

According to the present invention, a cap is provided over part of a die so that at least part of the die is sealed and protected. The die can then be enclosed with flowing plastic which does not reach the sealed part of the die. While this approach has broad applicability, it is especially appropriate for micromachined devices that have a movable mass, a diaphragm, or a sensor that has a vibrating member. In the case of an accelerometer, the cap covers, surrounds, and seals the movable mass from flowing plastic. A cap can also be used to protect a die from other material, such as particulates. The cap can be a paddle bonded over (instead of under) a die, or can be a cap member that is provided in addition to a paddle. The seal can be just sufficient to protect from particles or plastic, or it can be a hermetic seal.

In a first embodiment of the present invention, a paddle that is smaller than a typical paddle serves as a die mount and also serves as a cap. A rear side of the paddle is bonded over the face of the die rather than under it with an adhesive that seals the desired part of the micromachined device sufficiently to prevent contact from flowing plastic. No adhesive is deposited in a center area of the paddle so that a space is defined between the die and the paddle. Thus, the adhesive also serves as a standoff to prevent the rear side of the paddle from contacting the face of the die. Alternatively or in addition to using an adhesive as a standoff, the standoff can also be achieved by forming a depression in the center area of the paddle surface by one of several methods, such as chemical etching and stamping.

In a second embodiment of the present invention, a rear side of a silicon cap is bonded to the face of the die to seal and protect the micromachined features from external material, such as flowing plastic. A cap made from silicon minimizes stresses due to mismatches in the thermal expansion and allows the use of standard fabrication techniques. The rear side of the silicon cap can be etched at central portions to define a cavity surrounded by a peripheral bond face. The cavity creates more space than the space created by the thickness of the adhesives to prevent contact between the cap and the face of the die, to reduce electrical interactions between the die and the cap, and to provide more volume to adsorb moisture. Alternatively, this central portion can be electrochemically etched to form porous silicon. Porous silicon structures have oxide surfaces that absorb moisture. Thus porous silicon etched into the internal surface of the cap will getter any moisture which may diffuse through the adhesive seal.

In a third embodiment of the present invention, a cap is bonded over the die so that it hermetically seals a portion of the die. If the die has a sensor, such as a suspended mass for sensing acceleration, the hermetic seal keeps moisture from the mass. To form the hermetic seal, a layer of glass or metal is provided over a top surface of the die, typically over a passivation layer (such as glass) with a perimeter that surrounds the portion of the die to be sealed. A cap, preferably made from silicon, has an etched central area and a peripheral area with a layer of glass or metal. This layer on the cap and the layer on the surface of the die are heated to a sufficient temperature so that the layers bond to create a hermetic seal.

In a preferred embodiment, the layer patterned over the passivation layer of the surface of the die is aluminum, and the layer around the perimeter of the cap is made of gold. An intermediate layer can first be provided on the die to assist bonding. After the portion of the die is sealed with the cap, the device can, if desired, be enclosed in plastic.

In each embodiment, the cap, whether a metal paddle or a silicon cap, is preferably kept at a constant voltage to shield the microstructure from electromagnetic noise, thus minimizing the susceptibility of the microstructure to electromagnetic fields from surface static charges in service or during manufacture. The cap can be tied to ground or to some other reference voltage on the die. The cap preferably has a smaller area than the die to allow access to bondpads located around the periphery of the die, thus enabling the use of standard wirebond equipment.

Accordingly, by bonding a cap over a die, portions of the die are sealed mechanically and electrically, thus allowing dies with movable masses, such as accelerometers, or dies with pressure sensors to be protected from external materials, such as plastic packaging. The cap does not add to the thickness of the packaged die; and if the cap is the paddle, the thickness of the package can be reduced.

Other features and advantages of the present application will become apparent from the following detailed description when read in conjunction with the drawings, and from the appended claims.

DETAILED DESCRIPTION

The present invention relates to a method and apparatus for supporting and protecting a semiconductor die. While the method and apparatus of the present invention have broad applicability, they are described here primarily for packaging a die with a micromachined structure, such as an accelerometer, with flowing plastic. The method and apparatus of the present invention can also be used with other types of dies, and can be used to protect against other materials, such as particulates.

Figure 1:
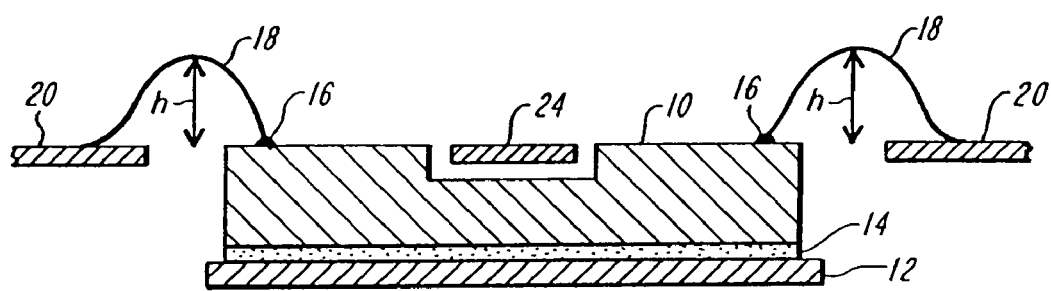
FIG. 1 is a cross-sectional view of a prior art accelerometer chip assembly.

Referring to FIG. 1, in a known accelerometer, an accelerometer chip (or die) 10 is mounted with an adhesive 14 on a metal paddle 12 which supports the chip. The chip has a number of peripheral ballbonds 16, which are electrically coupled through wirebonds 18 to a leadframe 20. The wirebonds are typically arched a height h over the die, and therefore require a clearance space over the die.

The chip has a movable mass 24, the details of which are not shown here. Briefly, mass 24 is mounted to chip 10 with anchors so that it can move back and forth along a desired axis. The mass has fingers extending perpendicular to the axis and between sets of stationary parallel plates. When the fingers move, a change in capacitance between the plates is detected, thus allowing the acceleration of mass 24 along the axis to be determined. For present purposes, it is important to note that in such a device, the mass must have the ability to move along the axis. Consequently, chip 10 cannot be enclosed through the use of molten plastic, because the plastic would affect the movement of mass 24 relative to the rest of chip 10.

Figure 2:
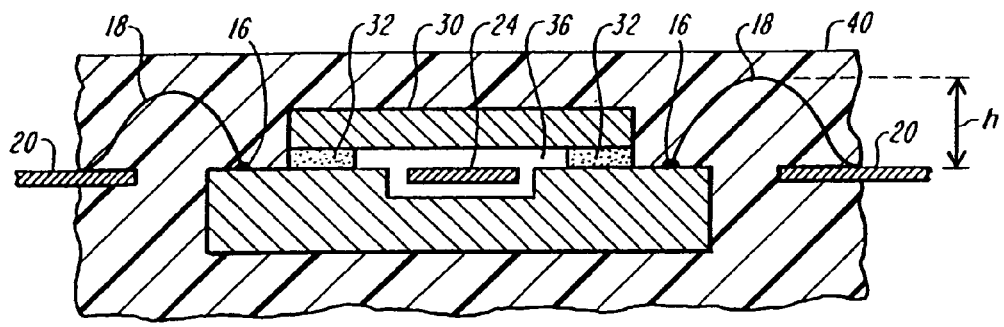
FIGS. 2 and 4 are cross-sectional views of an accelerometer chip assembly according to first and second embodiments of the present invention respectively.
Figure 3:
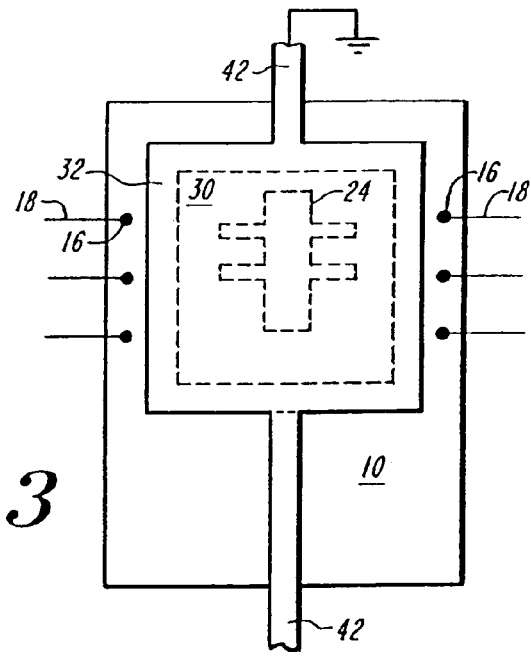
FIGS. 3 and 5 are plan views of the accelerometer chip assembly of FIGS. 2 and 4, respectively.

Referring to FIG. 2, in a first embodiment of the present invention, a paddle 30 is bonded over a face of chip 10 with an adhesive layer 32. Paddle 30 replaces the larger paddle 12 as shown in FIG. 1. Referring also to FIG. 3, paddle 30 has a perimeter that fully surrounds mass 24, but preferably does not block access to ballbonds 16. Typically, the area of paddle 30 is less than the area of the die.

Adhesive layer 32, in addition to bonding paddle 30 to chip 10, serves as a standoff to the die, thus defining between paddle 30 and mass 24 a void region 36 that prevents paddle 30 from contacting mass 24. A cutout region can be formed in the paddle, e.g., with chemical etching or stamping, to help create a larger void region. Preferably, the paddle is made of metal.

Preferably, the adhesive is organic, which tends to create less mechanical stress than an inorganic adhesive. An example of a thermoset, organic, non-conductive adhesive that can be used is Ablestik 660, available from Ablestik Laboratories, Rancho Dominguez, Calif.

The bond between the device and the paddle can be made by patterning adhesive layer 32 onto paddle 30 or by patterning the adhesive layer onto chip 10. The adhesive is preferably screen printed so that it has a seal width to thickness ratio that is greater than 10/1. By providing such a ratio, the seal is nearly hermetic and is at least sufficient to prevent the flowing plastic from entering void region 36.

In addition to mechanically shielding mass 24, paddle 30 also electrically shields mass 24. The paddle has members 42 that extend away from the mass. These members are coupled to the leadframe. By coupling the paddle to a fixed reference voltage, the accumulation of surface charge is avoided.

After paddle 30 is bonded to chip 10, plastic 40 is flowed over the chip and the paddle to encapsulate them. To prevent paddle 30 from contacting mass 24 during this flowing step, the paddle must have a bending stiffness that is sufficient to withstand plastic molding pressures (typically 1,000 psi at 175° C.) without excessive distortion.

As is evident from a comparison of the prior art FIG. 1 to FIG. 2 of the present invention, bonding the paddle over the chip does not increase the height of the device because the wirebonds already require a certain amount of space h over the chip. Indeed, this design is particularly attractive for thin devices, because it eliminates the thickness required for a paddle disposed underneath the die.

Figure 4:
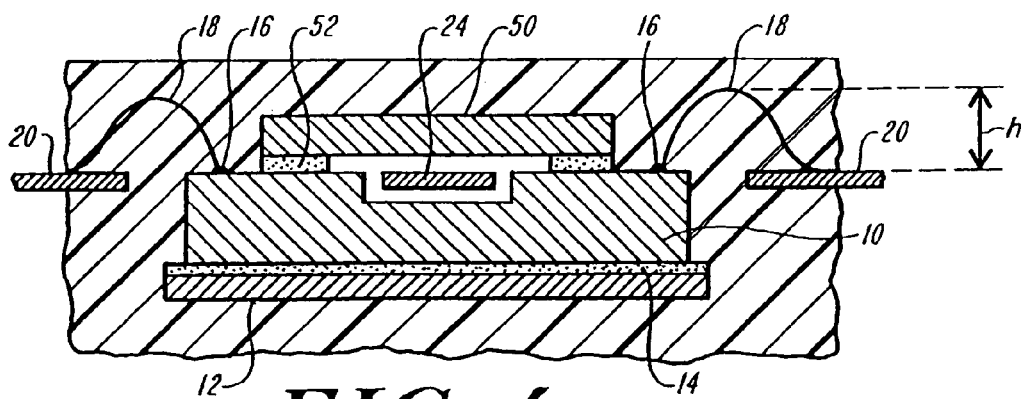

Referring to FIG. 4, in a second embodiment of the present invention, a silicon cap 50 is bonded to the top of chip 10 with an adhesive layer 52. As in prior art FIG. 1, chip 10 is mounted with adhesive 14 to paddle 12, and has peripheral ballbonds 16 coupled to leadframe 20 through wirebonds 18. As in the first embodiment, the perimeter of the silicon cap surrounds the mass or other part to be protected so that it can seal the mass, but the area of the cap is preferably smaller than the area of the die so that the ballbonds are not covered.

While the adhesive can serve as a standoff by itself, the silicon cap may also be etched to provide a central cavity that leaves a peripheral bond ring. A single mask process can be used to fabricate caps with 2-20 micron cavities, preferably 10-20 microns. The cavities are formed by plasma etching through an oxide layer, thus leaving a peripheral bond ring in the cap face. Deep cavities, 125-250 microns, can be made with a two mask process. A deep cavity better ensures that the cap will not contact the mass, and also provides more volume between the cap and the die to disperse moisture if needed.

In a preferred deep cavity embodiment, boron doped 100 oriented silicon wafers are isotropically etched in a 45% solution of potassium hydroxide. While the etch rate depends on many factors, including dopant level and temperature, at 70° C., the rate is typically about 30 microns per hour. Etchants, such as tetramethyl ammonium hydroxide, which do not contain alkali metals can also be used.

Alternatively, an electrochemical etch process can be used to form porous silicon which adsorbs moisture. See K. E. Peterson, Proc. IEEE 70, 420 (1982) and references therein; and R. C. Anderson et. al., "Porous Polycrystalline Silicon: A New Material for MEMS", J. Microelectromech. Systems, v.3(1), p. 10 (1994), and references therein. Each of these articles is incorporated herein by reference.

Figure 5:
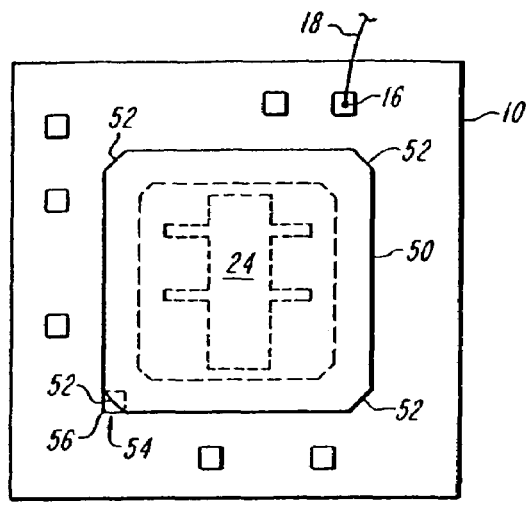

Referring also to FIG. 5, the cap 50 is maintained at a constant voltage to shield the die from airborne electromagnetic noise. In this embodiment, the cap is preferably bonded to a fixed voltage probe pad. The adhesive is patterned to have chamfered corners 52 that expose the corners of the silicon cap. Cutting the corners reduces stress, since the stress is greatest at the corners of a bond. An organic, conductive material 54, such as Ablestik 7052, available from Ablestik Laboratories, Rancho Dominguez, Calif., is provided at one corner of the cap to electrically connect the exposed silicon in the cap to a 0.2 volt probe pad 56 under the corner of the die. By electrically tying the cap to this fixed voltage, the cap minimizes the susceptibility to electromagnetic fields in service or during manufacture.

Figure 6:
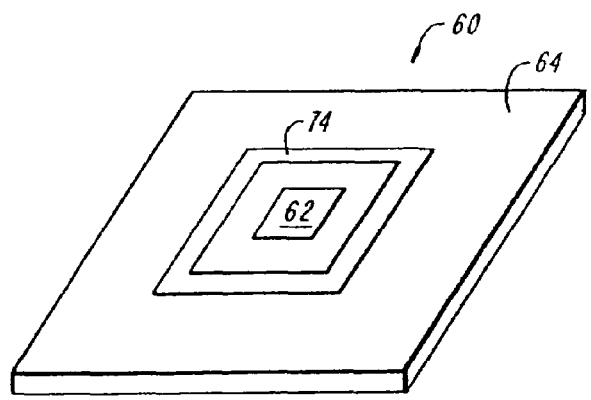
FIG. 6 is a perspective view of a die in a cap for hermetic sealing according to a third embodiment of the present invention.
Figure 7:
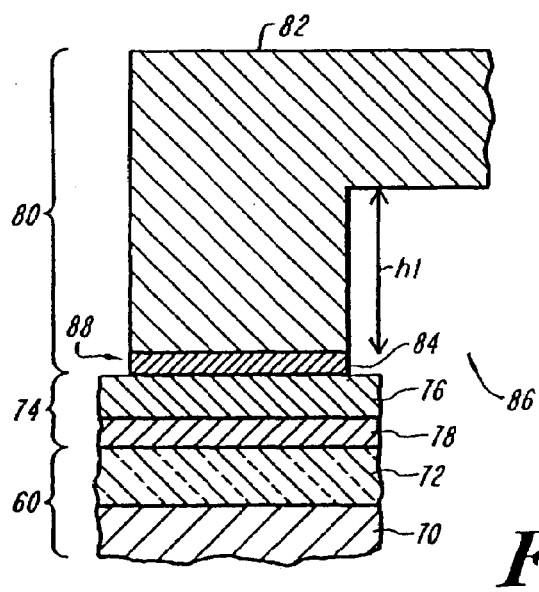
FIG. 7 is a cross-sectional view of the die and the cap of FIG. 6.

Referring to FIGS. 6 and 7, in a third embodiment of the present invention, a die 60 has a portion 62 to be protected, such as a sensor, formed in a face 64 of the die. Die 60 has a silicon substrate 70 and other various layers (not shown) with a top passivation layer 72, such as glass. A layer 74 of glass or metal is provided over top passivation layer 72 so that it surrounds portion 62. While this layer can include a number of different types of glasses or metals, it is preferred that this layer include a layer 76 of aluminum with an intermediate layer 78 to assist in bonding aluminum layer 76 to passivation layer 72. Intermediate layer 78 is preferably titanium tungsten.

A cap 80 has a silicon body 82 with a perimeter 88 that is coated with a layer 84 of glass or metal. While a number of different glasses and metals can be used, layer 84 is preferably made of gold. To form the hermetic seal, the cap is provided over the die and is heated to an appropriate temperature, preferably at least about 385° C., with thermo-sonic energy for a gold-aluminum bond. After the silicon cap is bonded to the face of the die, the die can be sealed, if desired, in a plastic package (which is non-hermetic).

The cap is preferably etched in the area 86 surrounded by perimeter 88 to form a void region with a height h1. As in the first two embodiments, the silicon cap is also preferably electrically coupled to a fixed voltage to control charges.

In the first and second embodiments, the adhesive can be applied to individual dies, or on a number of dies at a wafer level. If applied to a wafer of dies, the caps are mounted to the dies on the wafer and the dies are then separated from the wafer. Typically, the wafer is sawed to separate the dies.

The methods of the present invention can be used with the packaging of any type of chip in a plastic package where performance could otherwise be affected by particulates or by flowing plastic on the chip surface. Thus, the present methods could also be used whenever it is useful to have the low dielectric constant of air over a part of the die or low surface mechanical stress. For example, certain microsensors, such as micromachined pressure sensors, can be packaged for backside access because the void space under the paddle allows pressure to deflect the sensor diaphragm, as required for typical pressure sensors.

Hermetic sealing of the die allows the pressure levels and gas compositions to be controlled. This hermetic capability can be applied to use a vacuum under the cap to make a high-Q resonant sensor, or to make an absolute pressure sensor.

This process can also be used independent of plastic packaging. For example, dies which are sold for assembly in a multi-chip module (MCM) or hybrid applications can be capped with paddles. These shielded dies do not require subsequent clean room assembly because the paddle protects the microstructure from particulates. These dies can then be mounted and wire bonded with automated equipment in MCM assembly plants like other devices on the substrate. In this case, the seal between the cap and the die must be sufficient to keep out the particulates.

Having described embodiments of the present invention, it should be apparent that modifications can be made without departing from the scope of the invention as defined by the appended claims.

What is claimed is:

1. A semiconductor assembly comprising:
a die having a substrate;
a mass suspended over the substrate with anchors, and movable along a first direction, the movable mass having one or more fingers extending along a second direction perpendicular to the first direction; stationary plates, wherein movement of the movable fingers relative to the stationary plates causes a change in capacitance that is used to measure acceleration; and
a cap bonded to the die, the cap surrounding the mass, the die and the cap defining a space therebetween so that the cap does not contact the mass.

2. The assembly of claim 1, wherein the cap is hermetically bonded to the die.

3. The assembly of claim 1, wherein the cap includes silicon.

4. The assembly of claim 3, wherein the cap is bonded to the die with a glass seal.

5. The assembly of claim 1, wherein the cap includes a metal paddle.

6. The assembly of claim 1, wherein the cap is bonded to the die with a glass seal.

7. The assembly of claim 1, wherein the cap is bonded to the die with a metal seal.

8. The assembly of claim 1, wherein the die is an integrated circuit die that has an integrated circuit in addition to the movable member.

9. The assembly of claim 1, wherein the movable member moves laterally in a plane parallel to the substrate.

10. The assembly of claim 1, wherein the cap covers some, but not all, of the face of the die.

11. The assembly of claim 1, wherein the cap is bonded to the die with an adhesive, wherein the pattern of the adhesive is chamfered at the corners of the cap.

12. The assembly of claim 1, wherein the space is defined by a cavity in the cap, the cavity having a depth of 2-20 microns.

13. The assembly of claim 12, wherein the cavity has a depth of 10-20 microns.

14. The assembly of claim 1, wherein the space is defined by a cavity in the cap, the cavity having a depth of 125-250 microns.

15. A semiconductor assembly comprising:
a die having a substrate;
a mass supported over at least a portion of the substrate with anchors and generally lying in a first plane, the mass being movable along a first direction and having a sensing element;
a stationary structure that is not movable relative to the substrate, wherein movement of the sensing element relative to the stationary structure causes a change in an electrical characteristic that is sensed to detect motion in at least one direction;
a cap hermetically bonded to the die to create a vacuum environment, the cap surrounding the mass, the die and the cap defining a space therebetween so that the cap does not contact the mass; and
a plastic package encapsulating the die and the cap.

16. A semiconductor assembly comprising:
a die having a substrate, the substrate having a well;
a mass recessed in the well of the substrate, coupled to the substrate with anchors, generally lying in a first plane, and movable along a first direction relative to the substrate, the movable mass having one or more sensing elements;
a stationary structure, wherein movement of the sensing element relative to the stationary structure causes a change in an electrical characteristic that is detected to sense motion in at least one direction in the first plane; and
a cap bonded to the die, the cap surrounding the mass, the die and the cap defining a space therebetween so that the cap does not contact the mass.

17. A semiconductor assembly comprising:

a die having a substrate;

a mass suspended over the substrate with anchors and generally lying in a first plane, and movable along a first direction, the movable mass having one or more fingers extending along a second direction perpendicular to the first direction;

stationary plates, wherein movement of the movable fingers relative to the stationary plates causes a change in capacitance that is used to sense motion in at least one direction that is in the first plane; and a cap bonded to the die, the cap surrounding the mass, the die and the cap defining a space therebetween so that the cap does not contact the mass.

\* \* \* \* \*